United States Patent
Ang et al.

(10) Patent No.: US 7,022,625 B2
(45) Date of Patent: Apr. 4, 2006

(54) METHOD OF FABRICATING A GATE DIELECTRIC LAYER WITH REDUCED GATE TUNNELLING CURRENT AND REDUCED BORON PENETRATION

(75) Inventors: Chew Hoe Ang, Singapore (SG); Alan Lek, Singapore (SG); Wenhe Lin, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 102 days.

(21) Appl. No.: 10/205,517

(22) Filed: Jul. 25, 2002

(65) Prior Publication Data

US 2004/0018674 A1    Jan. 29, 2004

(51) Int. Cl.
 *H01L 21/31*   (2006.01)
(52) U.S. Cl. ............... 438/787; 438/287; 438/591
(58) Field of Classification Search ........... 438/287, 438/591, 787
See application file for complete search history.

(56) References Cited

U.S. PATENT DOCUMENTS

| 5,441,914 | A |   | 8/1995  | Taft et al. ............ 437/189 |
|---|---|---|---|---|
| 5,464,783 | A | * | 11/1995 | Kim et al. ............ 438/591 |
| 5,908,313 | A |   | 6/1999  | Chau et al. ............ 438/299 |
| 6,027,977 | A |   | 2/2000  | Mogami ............ 438/287 |
| 6,114,258 | A |   | 9/2000  | Miner et al. ............ 438/787 |
| 6,277,716 | B1|   | 8/2001  | Chhagan et al. ............ 438/584 |
| 6,350,708 | B1|   | 2/2002  | Hurley ............ 438/791 |
| 2004/0147136 | A1 |   | 7/2004  | Chen et al. ............ 438/778 |

* cited by examiner

*Primary Examiner*—Jack Chen
(74) *Attorney, Agent, or Firm*—George O. Saile; Rosemary L. S. Pike

(57) ABSTRACT

A method of forming a silicon nitride-silicon dioxide, composite gate dielectric layer, offering reduced risk of boron penetration from an overlying boron doped polysilicon gate structure, has been developed. A porous, silicon rich silicon nitride layer is first deposited on a semiconductor substrate, allowing a subsequent thermal oxidation procedure to grow a thin silicon dioxide layer on the semiconductor substrate, underlying the porous, silicon rich silicon nitride layer. A two step anneal procedure is then employed with a first step performed in a nitrogen containing ambient to densify the porous, silicon rich silicon nitride layer, while a second step of the anneal procedure, performed in an inert ambient at a high temperature, reduces the foxed charge at the silicon dioxide-semiconductor interface.

13 Claims, 2 Drawing Sheets

METHOD OF FABRICATING A GATE DIELECTRIC LAYER WITH REDUCED GATE TUNNELLING CURRENT AND REDUCED BORON PENETRATION

BACKGROUND OF THE INVENTION (1) Field of the Invention

The present invention relates to methods used to fabricate semiconductor devices and more specifically to a method used to fabricate a gate dielectric layer offering reduced tunnelling current and improved boron penetration characteristics.

(2) Description of Prior Art

Micro-miniaturization, or the ability to fabricate semiconductor devices with sub-micron features, has allowed the performance of sub-micron devices to be increased while the fabrication costs for these same devices have been reduced. The scaling down of semiconductor devices, such as N channel metal oxide semiconductor (NMOS), and P channel (PMOS), elements of complimentary metal oxide semiconductor (CMOS), has included the scaling down of the thickness of the gate insulator layer. The use of thin gate insulator layers have however presenting yield problems not encountered for counterpart devices comprised with thicker gate insulator layers. For example thinner gate insulator layers such as silicon dioxide insulator layers do not offer as much protection as thicker counterparts against boron penetration from overlying P type doped polysilicon gate structures, resulting in a degraded gate insulator layer as well as a dopant depleted gate structure. In addition the thinner gate insulator layers, again such as silicon dioxide, present a greater risk of high gate tunnelling currents, than tunnelling risks encountered with thicker gate insulator counterparts.

This invention will describe a method of forming a gate dielectric layer featuring characteristics wherein reduced boron penetration from an overlying polysilicon gate structure, as well as reduced tunnelling current, are realized. The gate dielectric layer offering the reduced boron penetration and reduced tunnelling current, is a silicon nitride-silicon dioxide composite insulator layer, formed via a novel process sequence that allows the desired scaled down thickness to be realized. Prior art such as Chhagan et al, in U.S. Pat. No. 6,277,716 B1, Chau et al, in U.S. Pat. No. 5,908,313, Taft et al, in U.S. Pat. No. 5,441,914, and Hurley, in U.S. Pat. No. 6,350,708 B1, describe methods of forming silicon nitride layers for various applications including use a gate insulator layer. However none of the prior art describe the novel process sequence of this present invention, in which a scaled down, silicon nitride-silicon dioxide composite layer is formed.

SUMMARY OF THE INVENTION

It is an object of this invention to fabricate a gate dielectric layer for complimentary metal oxide semiconductor (CMOS), applications, featuring resistance to boron penetration from an overlying boron doped, polysilicon gate structure, and offering a reduction in tunnelling current when compared to counterpart gate dielectric layers.

It is another object of this invention to fabricate a silicon nitride-silicon dioxide composite insulator layer for use as a gate dielectric layer.

It is still another object of this invention to form the silicon nitride-silicon dioxide gate dielectric layer via deposition of a porous silicon rich, silicon nitride layer, followed by an oxidation procedure creating an underlying silicon dioxide layer, and a subsequent ammonia treatment used to densify the porous silicon nitride layer.

In accordance with the present invention a method of fabricating a silicon nitride-silicon dioxide gate dielectric layer via a process sequence in which the composite gate dielectric layer is formed with reduced risk of boron penetration from overlying gate structures, as well as reduced tunnelling current, is described. A porous silicon rich silicon nitride layer is deposited on a semiconductor substrate, followed by a thermal oxidation procedure resulting in a thin silicon dioxide layer formed underlying the porous silicon rich silicon nitride layer. An anneal procedure, performed in a nitrogen containing ambient, is next performed for densification of the porous silicon rich silicon nitride layer, as well as to remove the fixed charge located at the silicon dioxide-semiconductor substrate interface. Conductive gate structures, including P type doped, polysilicon gate structures, are next formed on the composite dielectric layer comprised of densified silicon nitride on an underlying silicon dioxide layer.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
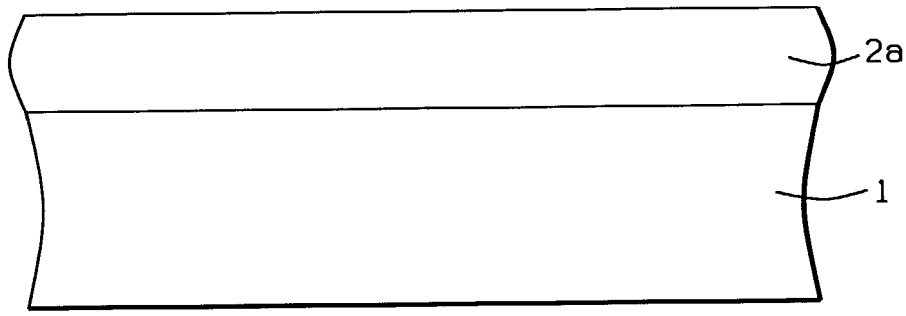
FIGS. 1–4, which schematically in cross-sectional style describe key stages used for fabrication of a silicon nitride-silicon dioxide gate dielectric layer, wherein a novel process sequence was employed to form the gate dielectric layer with reduced tunnelling current, and reduced risk of boron penetration from an overlying boron doped polysilicon gate structure.

The method of forming a silicon nitride-silicon dioxide gate dielectric layer via a process sequence allowing reduced gate tunnelling current to be realized, in addition to presenting a barrier to eliminate boron penetration from an overlying boron doped polysilicon gate structure, will now be described in detail. Semiconductor substrate 1, comprised of P type single crystalline silicon, featuring a <100>crystallographic orientation, is used and schematically shown in FIG. 1. Porous, or low density silicon nitride layer 2a, a silicon rich silicon nitride layer, is next deposited on semiconductor substrate 1, at a thickness between about 10 to 30 Angstroms, via low pressure chemical vapor deposition (LPCVD), or via plasma enhanced chemical vapor deposition (PECVD), procedures. The objective is to form a porous, or low density silicon nitride layer which will allow a subsequent thermal oxidation procedure to form a thin silicon dioxide layer on the semiconductor surface, via diffusion of oxygen through the porous regions of the silicon nitride layer, thus specific silicon nitride deposition conditions are needed. Therefore porous, silicon rich silicon nitride layer 2a, schematically shown in FIG. 1, is deposited at a temperature between about 750 to 900° C., at a pressure between about 30 to 50 torr, using between about 1 to 5 sccm of $SiH_4$, and between about 300 to 600 sccm of nitrogen.

Figure 2:
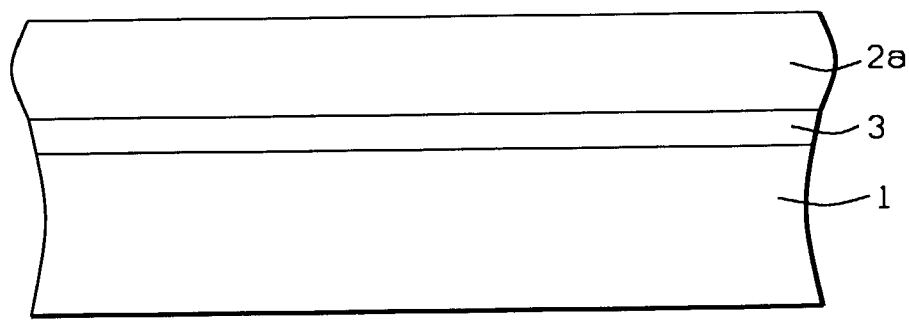

A thermal oxidation procedure, performed at a temperature between about 900 to 1050° C., is next performed in an oxygen ambient, resulting in the growth of silicon dioxide layer 3, on semiconductor substrate 1, underlying porous silicon nitride layer 2a. This is schematically shown in FIG. 2. The porosity of silicon nitride layer 2a, allowed oxygen to reach the surface of semiconductor substrate 1, resulting in the growth of silicon dioxide layer 3, at a thickness between about 2 to 10 Angstroms.

Figure 3:
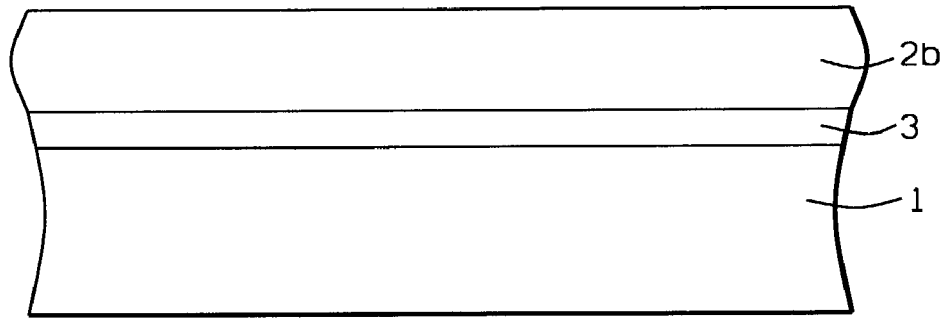

An anneal procedure is next performed to densify porous silicon nitride layer 2a, as well as to remove fixed oxide charges located at the silicon dioxide-semiconductor interface. A first cycle of the anneal procedure is performed at a temperature between about 800 to 1100° C., in an $NH_3$—NO ambient, for between about 30 to 150 sec. The first anneal cycle densifies porous silicon nitride layer 2a, resulting in a densified or less permeable, silicon nitride layer 2b. Silicon nitride layer 2b, now is stoichiometrically comprised as $Si_3N_4$. A second cycle of the anneal procedure is performed at a temperature between about 1000 to 1100° C., in an inert ambient such as nitrogen or argon, allowing the fixed positive charge located at the silicon dioxide-semiconductor substrate interface, occurring as a result of the previously performed thermal oxidation procedure, to be reduced. Thus a gate dielectric layer comprised of densified silicon nitride layer 2b, overlying silicon dioxide layer 3, shown schematically in FIG. 3, has been formed via the above process sequence, featuring deposition of a porous silicon nitride layer, formation of a silicon dioxide layer on the semiconductor surface, overlying the porous silicon nitride layer, and densification of the porous silicon nitride layer.

Figure 4:
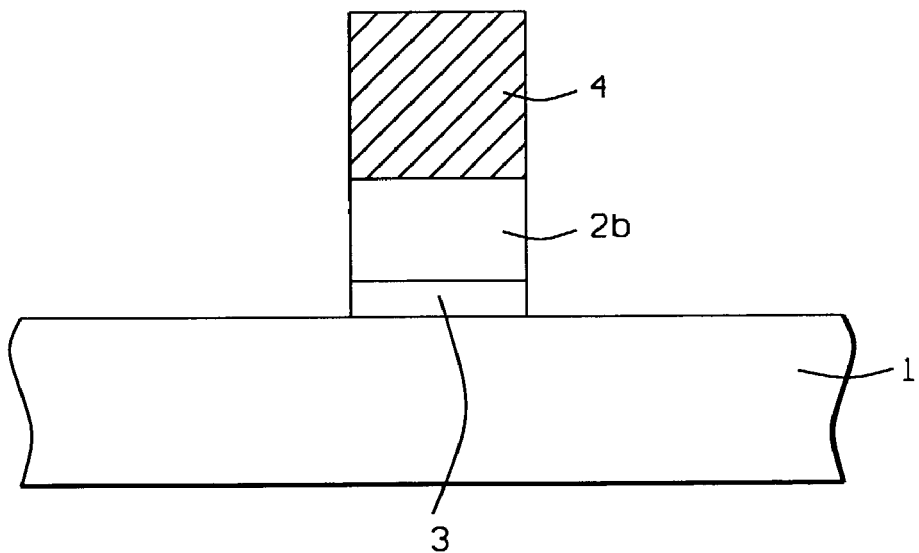

The formation of gate structure 4, on the underlying gate dielectric layer is next addressed and schematically described using FIG. 4. A polysilicon layer, doped with boron is deposited via LPCVD procedures at a thickness between about 500 to 3000 Angstroms. For purposes of this invention the polysilicon layer will be doped with boron for attainment of a specific work function and thus a specific threshold voltage. However if desired the polysilicon layer can be doped N type. A photoresist shape, not shown in the drawings, is used as an etch mask allowing an anisotropic reactive ion etching (RIE), procedure to define gate structure 4. The RIE procedure is performed using $Cl_2$ as an etchant for polysilicon, with an over etch cycle used to remove regions of silicon nitride layer 2b, not covered by the photoresist shape or by gate structure 4. Removal of the photoresist shape is accomplished via plasma oxygen ashing and wet clean procedures. The removal of regions of silicon dioxide layer 3, not covered by gate structure 4, is accomplished during a buffered hydrofluoric acid cycle of the wet clean procedure. Subsequent processing steps such as source/drain formation, performed at high temperatures, can result in boron penetration from the boron doped polysilicon gate structure, through thin silicon dioxide layer 3, altering the dopant characteristics of the channel region, adversely influencing device parameters and performance. The presence of densified silicon nitride layer 2b, prevented occurrence of this undesirable phenomena.

While this invention has been particularly shown and described with reference to, the preferred embodiments thereof, it will be understood by those skilled in the art that various changes in form and details may be made without departing from the spirit and scope of this invention.

The invention claimed is:

1. A method of forming a composite gate dielectric layer on a semiconductor substrate, comprising the steps of:
   depositing a porous, silicon rich silicon nitride layer, at a thickness between about 10 to 30 Angstroms on said semiconductor substrate;
   performing a thermal oxidation procedure to from a second dielectric layer on said semiconductor substrate, underlying said porous, silicon rich silicon nitride layer;
   performing an anneal procedure resulting in said composite gate dielectric layer comprised of densified said porous, silicon rich silicon nitride layer overlying said second dielectric layer; and
   forming a conductive gate structure on said composite gate dielectric layer.

2. The method of claim 1, wherein said porous, silicon rich silicon nitride layer is obtained via a low pressure chemical vapor deposition (LPCVD), or via a plasma enhanced chemical vapor deposition (PECVD), procedure, performed at a temperature between about 750 to 900° C.

3. The method of claim 1, wherein said porous, silicon rich silicon nitride layer is obtained via LPCVD or PECVD procedures using between about 1 to 5 sccm of $SiH_4$, and using between about 300 to 600 sccm of nitrogen.

4. The method of claim 1, wherein said second dielectric layer is a silicon dioxide layer at a thickness between about 2 to 10 Angstroms.

5. The method of claim 4, wherein said silicon dioxide layer is obtained via a thermal oxidation procedure performed at a temperature between about 900 to 1050° C.

6. The method of claim 4, wherein said silicon dioxide layer is obtained via a thermal oxidation procedure performed in an oxygen ambient.

7. The method of claim 1, wherein a first cycle of said anneal procedure is performed at a temperature between about 800 to 1100° C.

8. The method of claim 1, wherein a first cycle of said anneal procedure is performed in an $NH_3$—NO ambient.

9. The method of claim 1, wherein a first cycle of said anneal procedure is performed for a time between about 30 to 150 sec.

10. The method of claim 1, wherein a second cycle of said anneal procedure is performed at a temperature between about 1000 to 1100° C.

11. The method of claim 1, wherein a second cycle of said anneal procedure is performed in a nitrogen or argon ambient.

12. The method of claim 1, wherein said conductive gate structure is a boron doped, polysilicon gate structure.

13. The method of claim 1, wherein a second cycle of said anneal procedure, used to reduce fixed charge at a first dielectric layer-semiconductor substrate interface, is performed at a temperature between about 1000 to 1100° C., in a nitrogen or argon ambient.

* * * * *